United States Patent [19]

Andrus et al.

[11] 4,092,165

[45] May 30, 1978

[54] METHOD OF MAKING A DONOR MEMBER MOLD

[75] Inventors: Paul G. Andrus, Powell; Osmar A. Ullrich; James M. Hardenbrook, both of Columbus, all of Ohio

[73] Assignee: Xerox Corporation, Stamford, Conn.

[21] Appl. No.: 747,287

[22] Filed: Dec. 3, 1976

Related U.S. Application Data

[62] Division of Ser. No. 574,836, May 5, 1975.

[51] Int. Cl.$^2$ .......................... G03C 5/00; G03F 5/00

[52] U.S. Cl. .......................................... 96/38.2; 96/35; 96/27 R; 96/116

[58] Field of Search .................... 96/35, 38, 38.2, 116, 96/27 R; 204/3, 4, 6; 350/3 DD

[56] References Cited

U.S. PATENT DOCUMENTS

| | | | |
|---|---|---|---|
| 727,816 | 5/1903 | Lyon | 96/116 |
| 1,928,899 | 10/1933 | Kneeland | 96/35 |
| 2,080,965 | 5/1937 | Funck | 96/38 |
| 3,649,474 | 3/1972 | Blackeslee et al. | 204/6 |
| 3,867,264 | 2/1975 | Carson | 204/4 |

OTHER PUBLICATIONS deForest, W. S., Photoresist Materials and Processes, 1975, pp. 47, 48–62; McGraw-Hill, N. Y.

*Primary Examiner*—Edward C. Kimlin
*Assistant Examiner*—Alfonso T. Suro Pico
*Attorney, Agent, or Firm*—James J. Ralabate; Clarence A. Green; William A. Henry, II

[57] ABSTRACT

Electrostatic imaging apparatus for transfer development of latent images employing a developer donor member with a plurality of raised micro-pins on the donor surface, for self-spacing the donor from the imaging surface. Methods of producing such donors are disclosed.

2 Claims, 5 Drawing Figures

FIG. 1
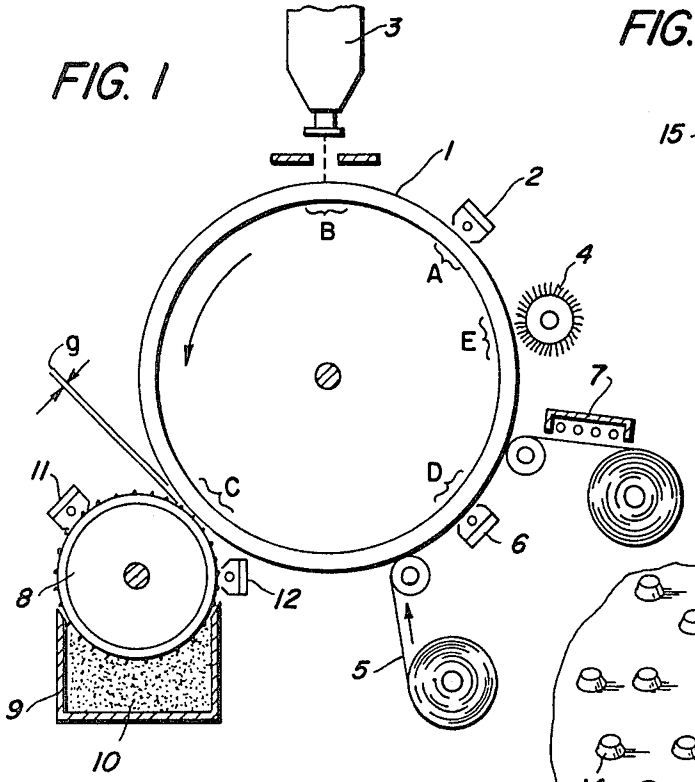
FIG. 2
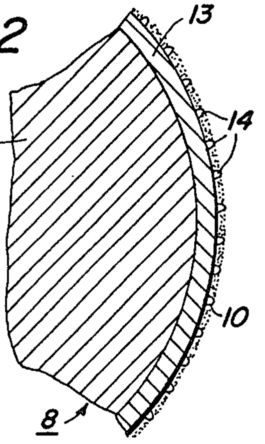
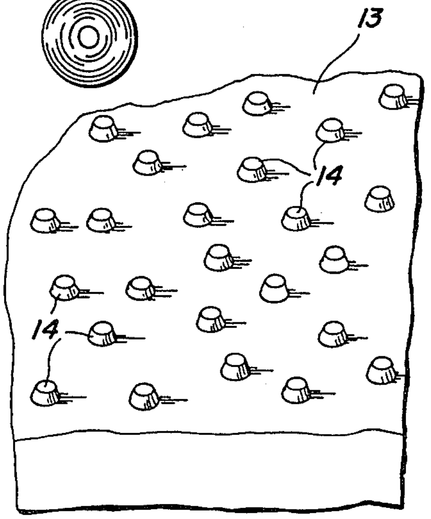
FIG. 3
FIG. 4
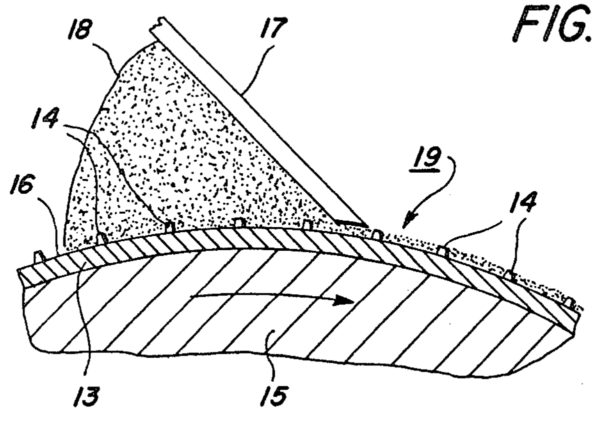
FIG. 5
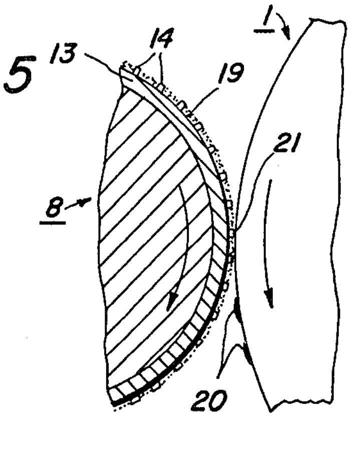

METHOD OF MAKING A DONOR MEMBER MOLD

This is a division, of application Ser. No. 574,836, filed May 5, 1975.

BACKGROUND OF THE INVENTION

The present invention is related to xerographic copying systems and, more particularly, to systems which employ what is known as "transfer" or "touchdown" development.

The xerographic process as disclosed in Carlson's U.S. Pat. No. 2,297,691, encompasses a xerographic plate comprising a layer of photoconductive insulating material on a conductive backing. This plate is provided with a uniform electric charge over its surface and is then light exposed to the subject matter to be reproduced. The light exposure discharges the plate areas in accordance with the radiation intensity that reaches it and thereby creates a latent electrostatically charged image on or in the photoconductive layer. Development of the latent image is effected with an electrostatically charged, finely divided material, such as an electroscopic powder, that is brought into surface contact with the photoconductive layer and is held thereon electrostatically in a selective pattern corresponding to the latent electrostatic image. Thereafter, the developed image may be fixed by any suitable means to the surface on which it has been developed or the developed image may be transferred to a secondary support surface to which it may be fixed or utilized by means known in the art.

Once the electrostatic latent image is formed, the method by which it is made visible is the developing process. Various developing systems are well known in the art and include cascade, brush development, magnetic brush, powder cloud and liquid development. Still another developing method is disclosed in Mayo U.S. Pat. No. 2,895,847 in which a developer support member, called a "donor," is employed to present a releasable layer of electroscopic (toner) particles to the photoconductive layer for deposit thereon in conformity with the electrostatic latent image. The Mayo approach is one of several variations which involve the transfer of toner particles from a donor to the photoconductive surface and is therefore called transfer development. This technique is also known as "touchdown development."

The three principal variations of transfer development include (1) an arrangement in which the layer of toner on the donor surface is held out of contact with the electrostatically imaged photoconductor and the toner must traverse an air gap to effect development; (2) an arrangement in which the toner layer on the donor is brought into rolling contact with the imaged photoconductor; and (3) an arrangement in which the toner layer is brought into contact with the imaged photoconductor and skidded across the imaged surface to effect development.

In the first of the above arrangements where the toner and photoconductor surface are maintained out of contact, a layer of toner particles is applied to a donor member which is capable of retaining the particles on its surface and then the donor member is brought into close proximity to the surface of the photoconductor. In this closely spaced position, particles of toner in the toner layer on the donor member are attracted to the photoconductor by the electrostatic charge on the photoconductor so that development can occur. Typically, the spacing between donor and photoconductor is between 1 and 10 mils. This arrangement is referred to as "spaced touchdown development."

In touchdown development, a variety of donor is possible and known in the art. A donor member may be constructed of a variety of materials which includes paper, plastic, cloth, metal, aluminum foil or metal-backed paper.

In U.S. Pat. No. 3,203,294 to Hope et al., various donors are described which employ the principle of using a set of conductive posts or a conductive screen which is charged in the same polarity and selective amount as the charged toner particles. Accordingly, as the donor member is brought into contact with the toner particles, those area adjacent to the posts or screen will electrostatically repel the toner, thereby forcing the toner away from those portions. The remaining areas of the donor member are charged to attract the toner particles and the particles accumulated there. As described in the Hope et al. patent, a spaced donor member of this type of construction provides better mobility to the toner particles so as to yield sharper xerographic copies.

In U.S. Pat. No. 3,375,806 to Nost, the donor member is described as being either electrically insulative or conductive and may comprise such materials as metal sheets, conductive rubbers, Mylar or the like.

Although spaced touchdown may be used with a variety of donor as discussed above, certain problems exist in this approach. One of the problems of the spaced donor arrangement is the difficulty of maintaining the aforementioned spaced relationship between the donor surface and the photoconductive surface. Additionally, in all transfer development systems, uniform deposition of toner onto the donor, which is a requirement for high quality prints, has been difficult to achieve because of the tendency of toner to clump and because of the internal electrostatic forces among the toner particles.

One approach for obviating the above problems has been the use of a donor member having a surface with raised and depressed portions, such as a gravure surface with an elevated grid network enclosing a plurality of depressed cups, as disclosed in Greig, U.S. Pat. No. 2,811,465. If such a donor member were used in contact with the imaging surface and doctored such that toner resided only in the cups, theoretically the toner would not contact the background, or uncharged, areas of the imaging surface. That is, the uniform gap between toner and image could be maintained by having the raised areas of the donor as the only point of contact on the imaging surface. Toner would, of course, still be attracted from the depressed portions of the donor to the charged areas, but the need for complicated, gap-controlling means would be eliminated. Additionally, the roughened surface would tend to break up clumps of toner during the loading step.

However, in practice, although such a donor member produced somewhat improved transfer development, it was found that toner could not be efficiently loaded on the donor without at least partially covering the raised grid structure with toner. Thus, toner was still contacting background areas of the imaging surface, thereby producing some background deposition in the copy. Also, the images produced bore the impression of the grid structure due to interference of the grid with complete toner deposition on the charged areas. Clearly, both the above results are undesirable in a high-quality imaging process.

SUMMARY OF THE INVENTION

It is accordingly an object of the present invention to provide an electrostatographic copying method and apparatus employing touchdown development with improved means for achieving self-spacing between the donor surface and the imaging surface.

It is a further object of the present invention to provide an improved method and apparatus for laying down a uniform layer of toner on a donor surface.

It is a further object to produce a donor having improved durability and strength characteristics not withstanding the physical pressures of toner loading and image development.

The above objects and other advantages are realized by providing, for example, in a xerographic transfer development apparatus, a developer donor member having disposed on its surface a plurality of raised, micro-pins in an amount sufficient to maintain a uniform gap between the floor of the donor surface and the imaging surface when they are in contact. The preferred method for producing such donor surfaces is photo-etching of light sensitive materials on a substrate to either directly produce the pins or form a mold against which the donor surface may be cast, to be described below.

The micro-pin spacing means serve three important functions:

1. They serve a metering function to control toner layer thickness during the doctoring process;

2. In the doctoring process they break up loose clumps of toner of the type present in any mass of small particles; and 3. They prevent compression of, and reduce contact of, the toner against the photoreceptor to the extent that background deposits are virtually eliminated, and images of very fine quality can be produced.

DESCRIPTION OF THE DRAWINGS

FIG. 1 schematically illustrates a spaced transfer, or touchdown development, xerographic imaging system, where the spacing is maintained by the raised elements on the donor surface.

FIG. 2 illustrates, in a side sectional view, a toner-bearing donor in accordance with this invention.

FIG. 3 is a top, enlarged representation of a section of donor surface, illustrating a typical distribution of the pin spacing elements of this invention.

FIG. 4 illustrates a doctor blade technique for distributing a uniform layer of toner between the spacing elements.

FIG. 5 illustrates a donor of this invention in self-spaced relationship with an imaging surface during image development.

DETAILED DESCRIPTION OF THE INVENTION

Referring initially to FIG. 1, shown there is a xerographic reproduction system compatible with the present invention, even though this invention is useful in any electrostatographic imaging system. The system comprises a xerographic photoconductive plate in the form of drum 1. The drum is driven by conventional means which rotates the surface counterclockwise through stations A – E as indicated in the figure. The drum has a suitable photosensitive surface, which may, for example, include selenium overlying a layer of conductive material, upon which a latent electrostatic image cna be formed. The various stations about the periphery of the drum are the charging station A, exposing station B, developing station C, transfer station D and cleaning station E. At the charging station A, a suitable charging means 2, such as a corotron, places a uniform electrostatic charge on the photoconductive surface. As the drum rotates, the charged area is brought to station B where a suitable exposing device 3 supplies the light image to be reproduced. A latent electrostatic image is thus formed on the surface of the drum. This image is then developed at station C by the application of a finely divided, pigmented, electroscopic powder called toner. The developed image then passes through transfer station D which includes the copy sheet 5, corona charging device 6 and fusing element 7. The last station E performs the function of cleaning the surface such as the use of brush 4 or any other suitable conventional device.

Referring particularly to the developing station C of FIG. 1, a donor member 8 is shown which is preferably clockwise rotatable by conventional means (not shown).

Adjacent donor member 8 is a toner reservoir 9 containing toner particles 10. The donor member or roll 8 is positioned so that a portion of its periphery comes into contact with toner 10. Also located around the donor roll 8 are charging means 11 and 12. Charging means 11, which may be a corona charging device, is adapted to place a uniform charge on the toner particles of a polarity opposite to the polarity of the latent image on the photoconductive drum. Charging means 12, also a corona charging device, is for neutralizing the donor to aid in the removal of residual toner by an appropriate cleaning means (not shown).

In this arrangement, the surface of donor member 8 has disposed thereon a plurality of raised, micron-sized pin elements so as to provide a small gap "g" as shown in FIG. 1 which can be approximately one to several mils. This gap may be filled or partially filled with electroscopic toner particles. In accordance with the present invention, this gap is maintained in a self-spacing manner as described below.

In FIG. 2, the cross-section of a donor member is shown. In the figure, an electrically conductive layer or member 13, is affixed to a flexible backing element 15. The conductive layer 13 may be aluminum, for example. The self-spacing elements 14 are either permanently adhered to, or integral with, the substrate. While it is not absolutely necessary, it is preferred that the substrate 13 be a conductive material, or a material capable of supporting an electrical bias, such as a dielectric, for reasons to be explained below.

In the preferred aspects of this invention, the self-spacing elements are pin or post-shaped; that is, a vertical cross-sectional area of an individual element is defined by substantially straight lines as opposed to a curved, or rounded area. Additionally, the base and any horizontal cross-section of an individual pin should be substantially equi-axed; that is, the geometrical axes of the base and cross-section should be approximately equal, such as would be the case if the pin is of cylindrical, conical, cubic, pyramidal, etc., shape.

The preferred pins of this invention resemble truncated cones. The tops of the preferred elements are substantially flat, or straight-lined, in vertical cross-section, and are substantially circular as seen in a top view or by horizontal cross-section. Everywhere herein, the terms horizontal and vertical refer to the floor of the donor surface or substrate.

The preferred height of the pin elements, as measured from the element base at the surface of the donor to the element top, is from about 1 to 3 mils. The pins should be relatively uniformly spaced apart from each other, and be present in a density sufficient to maintain a relatively uniform gap between the donor surface and the imaging surface, though not in such numbers as to prevent substantially complete development of the charged areas of the imaging surface. A preferred density is from about 5 to about 30 elements per square millimeter.

Although relatively uniform element-to-element spacing is preferred as mentioned before, it has been found that undesirable moire image effects may be produced if the geometrical array of elements is a perfectly repeated pattern. Thus, it is preferred that, within the element density range above, the array of elements across the donor surface be somewhat random, as in FIG. 3, such that moire effects are substantially eliminated.

Referring to FIG. 3, shown is a greatly enlarged representation of a preferred donor surface of this invention, illustrating the array of pin-shaped elements 14 across the floor of the donor surface 13. Depending on which of the below-described processes for making the donor are used, the elements 14 are either permanently adhered to surface 13 by physical chemical forces, or are integral with, and projections of, the surface material.

FIG. 4 shows a section of the donor member in which a doctor blade 17 which may be of a rigid or semirigid material such as steel, plastic or a vulcanized elastomer is used to distribute toner from a toner supply 18 between spacer elements 14 to form toner layer 19 on donor element surface 16. The doctor blade may be edged in any suitable fashion at the points of contact with the spacing elements. If the blade tip is pointed, the array of the elements 14 should be geometrically random enough across the donor surface that the blade will not dip between elements and thus form concavities in the toner layer. The blade tip may also be bevelled parallel to the donor surface, in which event the bevel width of the blade will in most instances span the elements sufficiently to prevent dipping into the toner.

Referring to FIG. 5, cylindrical donor 8 is shown in development contact with a xerographic drum 1 bearing an electrostatic latent image on its surface. The donor 8 rides on drum 1 by means of the contact of spacing elements 14 on the drum surface, as at contact point 21. It will be seen that, in this manner, the donor surface itself is kept from contact with the drum surface so that the toner layer 19 can be retained between spacing elements 14 in a non-compacted state. Also, if the toner layer thickness is kept at or below the average height of the elements 14 above the donor surface, little or no toner will contact the drum 1 in uncharged or background regions, thus substantially preventing toner deposits in non-image areas of the drum. Preferably, a suppressing bias is applied to the donor surface, of the same polarity as that of the latent image, and of course opposite that of the toner. This bias should be considerably smaller than the magnitude of the latent image charge. Thus, toner will tend not to be attracted to background areas, and will still be attracted by the much greater charge to develop it adequately.

As the donor 8 encounters the electrostatically imaged areas on drum 1, toner is selectively attracted to the drum and deposits thereon as the developed image 20.

The preferred methods for preparing the donor surfaces useful in this invention involve the use of photomechanical materials, such as photopolymers and photoresists. Basically, donor surfaces can be prepared from any of the following procedures:

(a) exposing a layer of photo-hardenable material, coated on a suitable substrate, through a transparency having a pattern of small clear dots; and dissolving and washing away the non-hardened portions of the layer to leave the hardened, pin elements permanently adhered to the substrate;

(b) exposing a layer of photo-softenable material on a substrate through a similar transparency; washing out the softened areas to leave the desired depressions or cups in the film; casting a suitable donor material over the residual film-substrate complex to form the donor surface; and removing the cast; and (c) performing the steps in (a) or (b) above, but using the mold or cast so formed as a structure upon which is plated or cast the actual donor material to form the donor surface.

An example of the procedure of (a) follows:

EXAMPLE I

A donor surface in accordance with the present invention was prepared as follows: a 30% suspension of polyvinyl alcohol-water (Alcoset, Colonial Printing Co. Inc., East Rutherford, N.J.), containing also about 0.15% ammonium dichromate, was metered onto a 6 mil thick aluminum lithographic plate with a ⅝ inch diameter drill rod spaced from the plate along both sides with shims 12 to 18 mils thick. A layer of the PVA mixture about 6 to 8 mils thick was produced which dried to 1.7 to 2.5 mils thick. The PVA coated plate was then exposed to a high intensity carbon arc of 200 to 300 lux for 5 minutes, at a distance of 1 meter at 100 amp, through a Kodalith transparency having irregularly spaced clear circular areas about 1.5 mils in diameter and roughly 10 mils apart in an area about 7 inches by 8¼ inches. The exposed photosensitive layer was washed in warm water to removal all of the PVA in the unexposed non-hardened areas, and drying resulted in a plate with truncated, conical pins 2 to 3 mils high and 1.5 to 2 mils in diameter at the top, expanding to 3.5 mils diameter at the base. The tops of the pins were essentially flat and circular and the pins were observed to be well fixed to the aluminum plate.

The process of this invention is illustrated as follows:

EXAMPLE II

A developer donor was prepared by maintaining a donor surface prepared according to Example I on a ½ inch thick sponge rubber pad. The donor was loaded by depositing a ½ inch high ridge of toner along the end of the donor and doctoring it across the plate with a square edged steel blade about 8 mils thick, 9 inches long, backed by a ⅛ inch thick aluminum strip mounted on the rear side ½ inch from the doctoring edge. The blade was held at about 45° from the vertical and drawn across the donor at a rate of about 2½ inches per second with a vertical force against the donor of about 100 grams per inch. The toner used was Xerox 914 toner. After loading, the donor was corona charged to between −50 and −150 volts.

A Type E xerographic plate was charged to +800 volts and imagewise exposed so as to have a residual potential in the exposed areas of about 10 volts or less, and the donor maintained at +100 to +300 volts — roughly twice the potential carried by the toner to suppress background. The developed images were transferred from the plate to plain paper and heat fixed in the conventional manner. Before reloading the donor, it was exposed to a-c corona without removing the unused toner. This reduces the charge on the toner by about 50%.

The image resolution achieved was about 7 line pairs per millimeter, with image density at about 1.05. Fine halftone dots were copied fairly well. Solid area coverage was good.

EXAMPLE III

A donor surface was prepared using a DuPont photopolymer printing plate (Dycril). This plate consists of a transparent material on a red-pigmented layer supported on a flexible steel sheet about 10 mils thick. The plate was exposed through a transparency consisting of 1.5 mil circular clear dots on an opaque background. The 7 mil thick sensitizied Dycril material was exposed so as to harden in the dot areas entirely through its thickness. The prints are developed by washing with a dilute solution of sodium hydroxide. A wash-out time of 45 seconds was used to develop the plate. The resultant plate bore pins having substantially circular flat tops of about 1.5 mils diameter and of 2 to 3 mils in height.

EXAMPLE IV

A donor surface was prepared using a photohardenable resist, Riston 30S, manufactured by DuPont. The resist is applied in film form and heat laminated to a surface where it can be exposed, developed with chlorothene NU, and then used as an etching or electroforming resist. Several donors were made from this material using moderate carbon arc exposures, using Riston film in a thickness of about 2.9 mils, and surfaces having pins which were nearly cylindrical were produced. The pins were about 1.5 mils diameter and about 3 mils high. Generally, the material is too fragile for use directly as a donor. Normal doctoring pressure causes breakage of the pins away from the substrate, but it has been found that surfaces thus prepared can be used as intermediates in the preparation of actual donor surfaces.

The procedure of (b) is illustrated by the following:

EXAMPLE V

A solution of Kodak Audopositive Resists (KAR-3), Eastman Kodak, Inc., containing about 50% solids was coated onto a 6 mil thick aluminum lithoplate in a thickness of about 3.5 mils using a smooth drawdown rod riding on spacers. The coating dried to about 1.7 mils thickness. The coated plate was exposed through a transparency having 1.8 mil diameter clear circular dots (100 amp carbon arc at 1 meter for 5 minutes), was developed, and then exposed a second time and developed again to washout the softened resist down to the aluminum surface. This mold was then chemically silvered using a commercial 2-gun spray silvering technique, and placed in a bright nickel plating bath, where a layer of nickel about 6 mils thick was deposited. The nickel layer was then peeled from the KAR mold, cleaned of residual KAR-3 material, leaving the well formed pins which were of course integral with the floor of the donor surface. The pins averaged about 2 mils in diameter and 1.7 mils in height.

EXAMPLE VI

A donor surface was prepared according to the procedure of (c) as follows:

A surface configuration having raised pins was prepared from a Riston film coated on a substrate as illustrated in Example IV above. The Riston master was then chemically silvered. A layer of bright nickel was then electroplated onto the silvered Riston master. The Riston material was then dissolved away from the nickel mold, thus emptying the holes. The nickel mold was then chemically passivated, and another layer of bright nickel was electroplated into the former nickel mold to form the actual donor surface. The nickel donor was then physically separated from the nickel mold for use.

Generally donor surfaces useful in the process of this invention may be prepared from any durable material which is available to withstand the physical pressures of doctoring and development without breakage of pins from the surface, such as electroplated nickel, pressure-molded polyurethane, and so forth. It is preferred that the floor of the donor surface be made of a material which is either conductive or capable of retaining an electrical bias. Although not critical, preferred pin-base axes or diameters do not exceed pin heights. Preferably the donor surface is mounted on a flexible, compressible backing material. Such a backing allows the donor surface to more easily conform to the imaging surface which is to be developed. Additionally it has been found that loading of the toner onto the donor surface is greatly facilitated when the donor surface is so mounted.

The developer material, or toner, may be any of the commonly known particulate materials capable of rendering visible, and being attracted to, an electrostatic latent image. In use, the toner is electrically charged with a polarity opposite to the charge which comprises the latent image. It is preferred, but not necessary that the toner be charged following doctoring onto the donor surface, and preventing development of the latent image.

What is claimed is:

1. A method for fabricating a donor member having a surface capable of supporting a layer of particulate latent image developing electroscopic powder, said surface having permanently disposed thereon a plurality of raised, discrete micro-pin self-spacing elements, which comprises:

(a) exposing a layer of photo-softenable material having a thickness of about 1.7 mils to about 3.5 mils coated on a substrate, through a transparency having a relatively uniform pattern of small clear dots of about 1.8 mils in diameter;

(b) removing the softened areas to leave depressions in said material;

(c) electroplating said material with a second material to form from said second material a member having disposed on one surface a pattern of said raised, discrete micro-pin elements, and (d) separating said member formed with said second material from the material formed in step (b).

2. A method for fabricating a donor member having a surface capable of supporting a layer of particulate latent image developing electroscopic powder, said surface having permanently disposed thereon a plurality of raised, discrete micro-pin self-spacing elements, which comprise;

(a) exposing a layer of photo-hardenable material having a thickness of about 2.9 mils, coated on a substrate, through a transparency having a relatively uniform pattern of small clear dots of about 1.5 mils in diameter;

(b) removing the non-hardened portions of the layer to leave the hardened, micro-pin elements permanently adhered to the substrate;

(c) electroplating a layer of a suitable material including nickel upon the micro-pin composite to form a mold;

(d) removing the micro-pin composite from the nickel mold;

(e) passivating the nickel mold;

(f) electroplating the nickel mold with a suitable material including nickel to form a donor member; and (g) separating the donor member from said mold.

* * * * *